United States Patent
Su et al.

(10) Patent No.: US 10,242,941 B1
(45) Date of Patent: Mar. 26, 2019

(54) APPARATUS, SYSTEM, AND METHOD FOR MITIGATING WARPAGE OF LIDLESS INTEGRATED CIRCUITS DURING REFLOW PROCESSES

(71) Applicant: Juniper Networks, Inc., Sunnyvale, CA (US)

(72) Inventors: Peng Su, Santa Clara, CA (US); Helen L. Turner, Cupertino, CA (US); Marc D. Hartranft, Scotts Valley, CA (US); Gautam Ganguly, San Jose, CA (US); Guhan Subbarayan, Fremont, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 0 days.

(21) Appl. No.: 15/671,083

(22) Filed: Aug. 7, 2017

(51) Int. Cl.
| | | |
|---|---|---|
| *H01L 23/04* | (2006.01) |
| *H01L 23/498* | (2006.01) |
| *H01L 21/768* | (2006.01) |
| *H05K 3/34* | (2006.01) |
| *H05K 3/24* | (2006.01) |

(52) U.S. Cl.
CPC .. *H01L 23/49816* (2013.01); *H01L 21/76882* (2013.01); *H05K 3/24* (2013.01); *H05K 3/3494* (2013.01)

(58) Field of Classification Search
CPC ....... H01L 2924/00014; H01L 2924/00; H01L 2224/45147; H01L 2224/48091; H01L 2224/48227; H01L 2924/181; H01L 2224/32225; H01L 2924/00013; C08L 63/00; A61K 2300/00; A61K 31/015; A61K 31/045; A61K 31/352; A61K 31/05; A61K 36/185; A61K 31/355; A61K 38/00; A61K 45/06; A61K 48/00; A61K 9/0073; A61K 9/0078

See application file for complete search history.

(56) References Cited

U.S. PATENT DOCUMENTS

| | | | |
|---|---|---|---|
| 2006/0038287 A1* | 2/2006 | Hamasaki ............ | G02B 6/3817 257/726 |
| 2011/0235283 A1* | 9/2011 | Brown .................. | H01L 23/562 361/747 |

OTHER PUBLICATIONS

Peng Su et al.; Apparatus, System, and Method for Precise Heatsink Alignment on Circuit Boards; U.S. Appl. No. 15/723,098, filed Oct. 2, 2017.
Peng Su et al.; Apparatus, System, and Method for Mitigating Warpage of Circuit Boards During Reflow Processes; U.S. Appl. No. 15/723,105, filed Oct. 2, 2017.

* cited by examiner

*Primary Examiner* — Robert G Bachner
(74) *Attorney, Agent, or Firm* — FisherBroyles, LLP

(57) ABSTRACT

The disclosed apparatus may include (1) a stiffening brace that (A) is coupled to a top surface of a lidless integrated circuit and (B) includes at least one joint and (2) a removable lid that (A) interfaces with the stiffening brace at the joint, (B) temporarily sits atop the stiffening brace during a reflow process in which a bottom surface of the lidless integrated circuit is soldered to a circuit board, and (C) provides structural support to the lidless integrated circuit to impede the lidless integrated circuit from warping during the reflow process. Various other apparatuses, systems, and methods are also disclosed.

17 Claims, 4 Drawing Sheets

APPARATUS, SYSTEM, AND METHOD FOR MITIGATING WARPAGE OF LIDLESS INTEGRATED CIRCUITS DURING REFLOW PROCESSES

BACKGROUND

Electronic components (such as integrated circuits) are often soldered to circuit boards by way of a process known as reflow soldering. For example, prior to initiating a reflow process, solder paste may be disposed on contact pads located on a circuit board, and then electronic components may be placed on top of the solder paste, which holds the electronic components in position atop their corresponding contact pads. After the electronic components have been put in place, the circuit board may undergo a reflow process that heats the solder paste to a certain temperature. The temperature must be hot enough to melt the solder paste such that, once cooled off, the solder forms permanent connection joints between the electronic components and their corresponding contact pads.

Unfortunately, electronic components with large package sizes, especially those of lidless construction, may pose and/or represent a significant challenge during the soldering process. For example, a reflow process may apply so much heat to a lidless integrated circuit that the package of the lidless integrated circuit warps. This warpage may bend the package such that permanent connection joints are unable to form between the connection terminals on the integrated circuit and the corresponding contact pads on the circuit board. As a result, the integrated circuit may fail to achieve full connectivity with the remaining electronic components laid out on the circuit board. Without full connectivity, the circuit board may fail to work as intended, leaving the computing device in which the circuit board is installed inoperable for its intended purpose.

The instant disclosure, therefore, identifies and addresses a need for apparatuses, systems, and methods for mitigating warpage of lidless integrated circuits during reflow processes.

SUMMARY

As will be described in greater detail below, the instant disclosure generally relates to apparatuses, systems, and methods for mitigating warpage of lidless integrated circuits during reflow processes. In one example, an apparatus for accomplishing such a task may include (1) a stiffening brace that (A) is coupled to a top surface of a lidless integrated circuit and (B) includes at least one joint and (2) a removable lid that (A) interfaces with the stiffening brace at the joint, (B) temporarily sits atop the stiffening brace during a reflow process in which a bottom surface of the lidless integrated circuit is soldered to a circuit board, and (C) provides structural support to the lidless integrated circuit to impede the lidless integrated circuit from warping during the reflow process.

Similarly, a lidless integrated circuit incorporating the above-described apparatus may include (1) a die, (2) a stiffening brace that (A) is coupled to a top surface of the lidless integrated circuit, (B) at least partially surrounds the die, and (C) includes at least one joint, and (3) a removable lid that (A) interfaces with the stiffening brace at the joint, (B) temporarily sits atop the stiffening brace during a reflow process in which a bottom surface of the lidless integrated circuit is soldered to a circuit board, and (C) provides structural support to the lidless integrated circuit to impede the lidless integrated circuit from warping during the reflow process.

A corresponding method may include (1) coupling a stiffening brace to a top surface of a lidless integrated circuit and (2) temporarily placing a removable lid atop the stiffening brace prior to a reflow process in which a bottom surface of the lidless integrated circuit is soldered to a circuit board such that the removable lid (A) interfaces with the stiffening brace at one or more joints and (B) provides structural support to the lidless integrated circuit to impede the lidless integrated circuit from warping during the reflow process.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Figure 1:
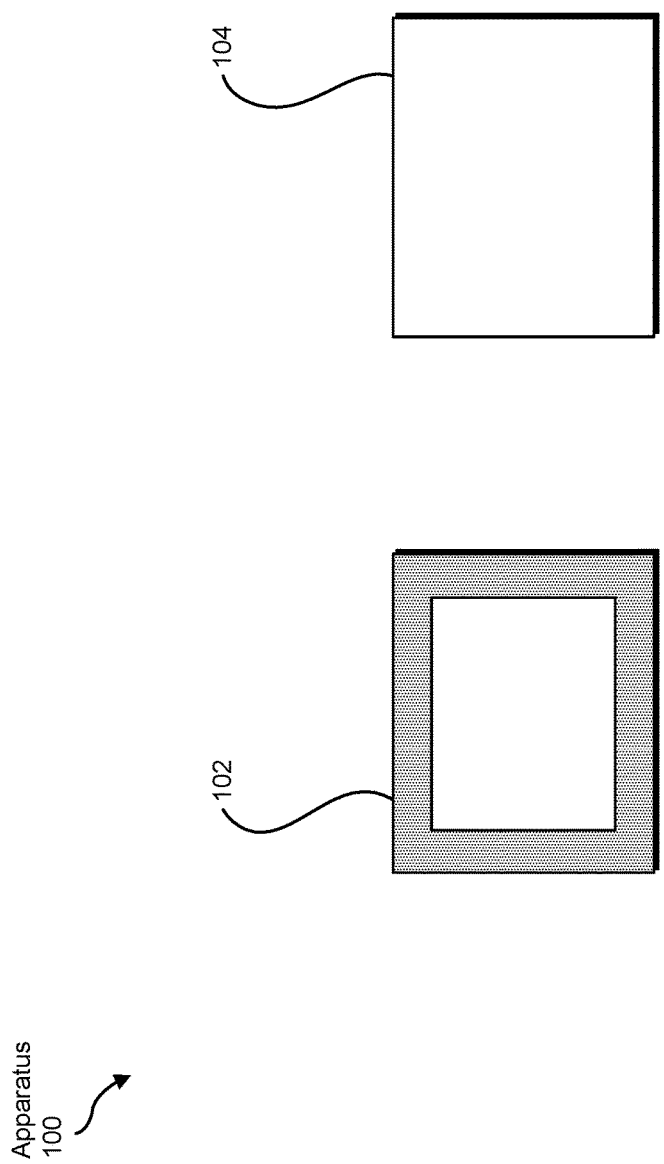
FIG. 1 is a block diagram of an exemplary apparatus for mitigating warpage of lidless integrated circuits during reflow processes.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for mitigating warpage of lidless integrated circuits during reflow processes. As will be explained in greater detail below, embodiments of the instant disclosure may involve fastening a stiffening brace to a top surface of a lidless integrated circuit and then temporarily placing a removable lid atop the stiffening brace for structural support during the reflow process. For example, the removable lid, which is temporarily sitting atop the stiffening brace, may provide structural support to the package of the lidless integrated circuit during the reflow process. By doing so, the removable lid may effectively impede the lidless integrated circuit from warping during the reflow process even though the reflow process reaches a temperature that would have otherwise caused warpage had the removable lid not been placed atop the stiffening brace.

Figure 2:
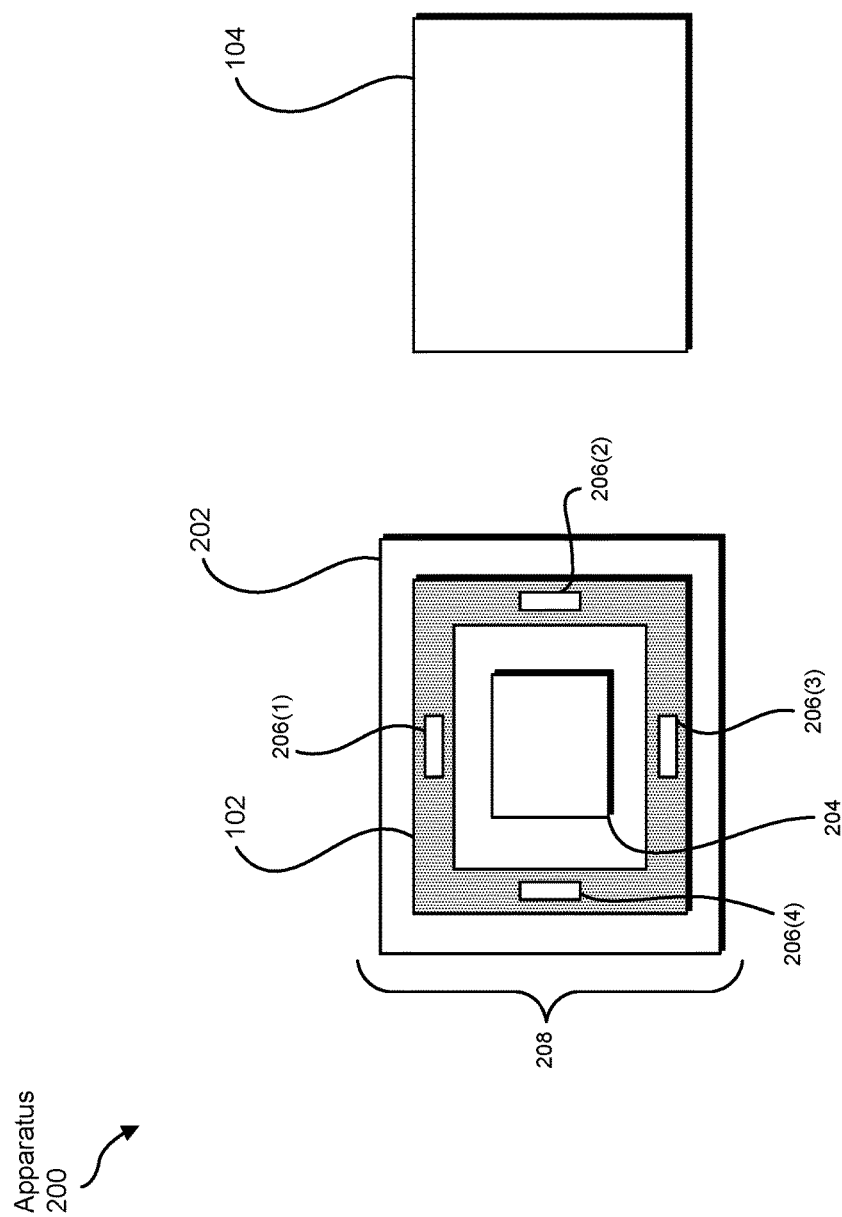
FIG. 2 is a block diagram of an exemplary apparatus for mitigating warpage of lidless integrated circuits during reflow processes.
Figure 3:
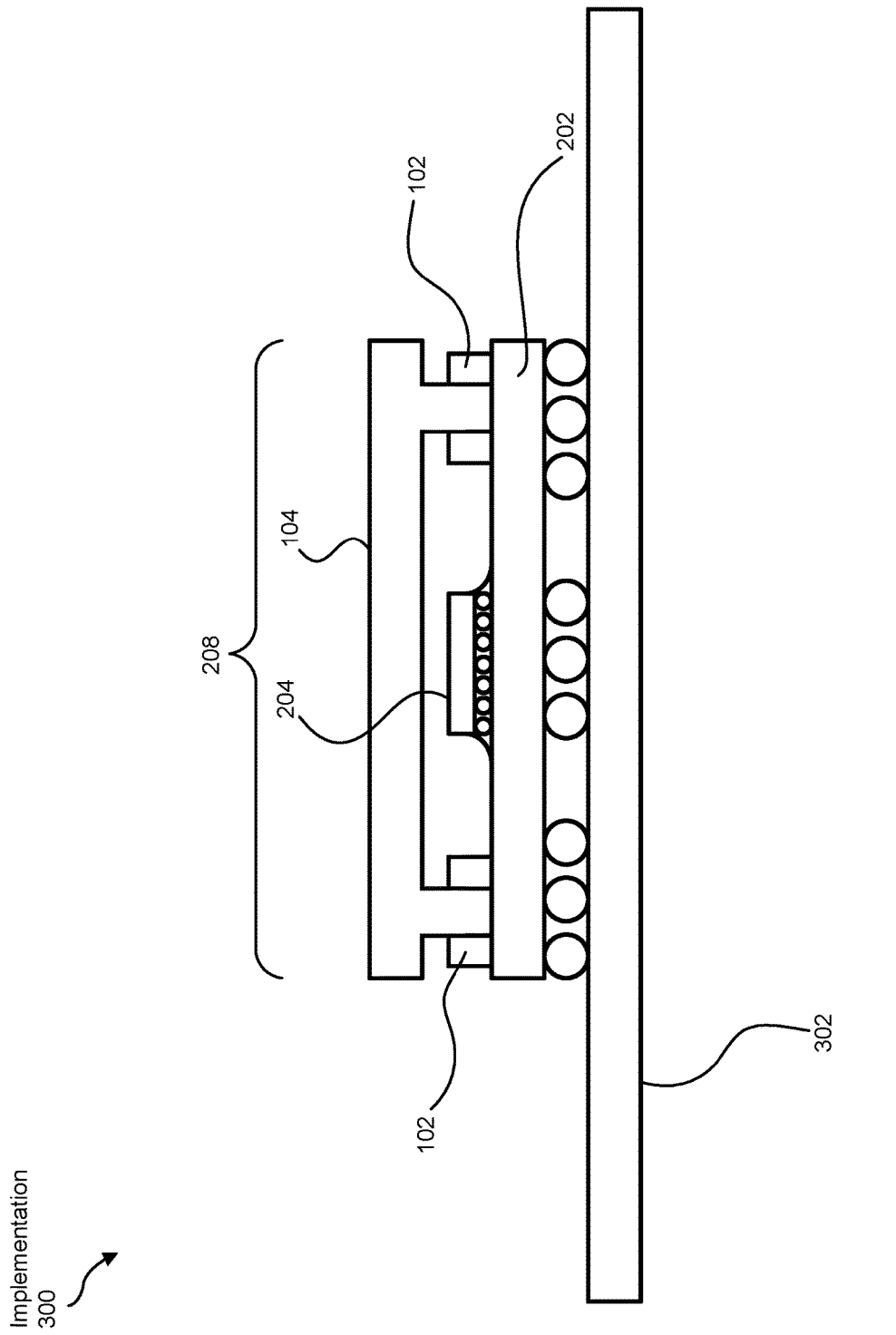
FIG. 3 is a block diagram of an exemplary implementation of an apparatus for mitigating warpage of lidless integrated circuits during reflow processes.

The following will provide, with reference to FIGS. 1-3, examples of apparatuses and/or corresponding components and implementations that facilitate mitigating warpage of lidless integrated circuits during reflow processes. In addition, the following will provide, with reference to FIG. 4, examples of methods for mitigating warpage of lidless integrated circuits during reflow processes.

FIG. 1 shows an exemplary apparatus 100 for mitigating warpage of lidless integrated circuits during reflow processes. As illustrated in FIG. 1, apparatus 100 may include and/or represent a stiffening brace 102 and a removable lid 104. The term "stiffening brace," as used herein, generally refers to any type or form of physical material, structure, and/or support feature that fastens, couples, and/or adheres to a top surface of a lidless integrated circuit. In one example, stiffening brace 102 may include and/or represent a ring that is fixed to the top surface of a lidless integrated circuit. In this example, the top surface of the lidless integrated circuit may include and/or represent the top surface of the substrate of the lidless integrated circuit. Stiffening brace 102 may at least partially surround a die of the lidless integrated circuit.

Stiffening brace 102 may include and/or form any suitable shape. In some examples, stiffening brace 102 may form a square, a circle, and/or a rectangle. Additional examples of shapes formed by stiffening brace 102 include, without limitation, triangles, pentagons, hexagons, octagons, ovals, diamonds, parallelograms, combinations or variations of one or more of the same, and/or any other suitable shapes.

In addition, stiffening brace 102 may be of any suitable dimensions. In one example, stiffening brace 102 may encompass and/or follow the perimeter of the package of the lidless integrated circuit. In another example, stiffening brace 102 may encompass and/or follow the outer perimeter of the substrate of the lidless integrated circuit. In a further example, stiffening brace 102 may encompass and/or follow the outline of the die(s) within the lidless integrated circuit.

Stiffening brace 102 may include and/or contain any various materials. Examples of such materials include, without limitation, plastics, ceramics, polymers, metals, composites, combinations or variations of one or more of the same, and/or any other suitable materials.

In some examples, stiffening brace 102 may serve as a foundation and/or base for removable lid 104 that provides structural support, tension, and/or integrity to the lidless integrated circuit. In one example, removable lid 104 may interface with stiffening brace 102. For example, removable lid 104 may be placed and/or positioned atop stiffening brace 102 prior to the reflow process in which the bottom surface of the lidless integrated circuit is soldered to a circuit board. In this example, removable lid 104 may temporarily sit atop stiffening brace 102 during the reflow process. While sitting atop stiffening brace 102, removable lid 104 may provide structural support to the lidless integrated circuit. By providing structural support to the lidless integrated circuit in this way, removable lid 104 may, in conjunction with stiffening brace 102, impede the package of the lidless integrated circuit from warping during the reflow process.

Removable lid 104 may include and/or form any suitable shape. In some examples, removable lid 104 may form a square, a circle, and/or a rectangle. Additional examples of shapes formed by removable lid 104 include, without limitation, triangles, pentagons, hexagons, octagons, ovals, diamonds, parallelograms, combinations or variations of one or more of the same, and/or any other suitable shapes. In one example, the shape of removable lid 104 may match and/or coincide with the shape of stiffening brace 102.

FIG. 2 shows an exemplary apparatus 200 for mitigating warpage of lidless integrated circuits during reflow processes. As illustrated in FIG. 2, apparatus 200 may include and/or represent a lidless integrated circuit 208 and removable lid 104. In some examples, lidless integrated circuit 208 may be packaged as a surface-mount component. For example, lidless integrated circuit 208 may be packaged as a Ball Grid Array (BGA). Additional examples of such surface-mount component packages include, without limitation, dual-in-line packages, quad-in-line packages, grid array packages, combinations and/or variations of one or more of the same, and/or any other suitable surface-mount component packages.

In one example, lidless integrated circuit 208 may include a substrate 202 and a die 204. In this example, die 204 may be set on and/or attached or coupled to substrate 202.

In one example, substrate 202 may include and/or represent a wafer of semiconductor materials (such as silicon, germanium, and/or gallium arsenide). In another example, substrate 202 may include and/or represent a wafer of electrical insulator materials (such as silicon dioxide, sapphire, aluminum oxide, polymers, and/or ceramics). Substrate 202 may include multiple layers of insulation materials. Substrate 202 may also include copper traces and/or through-silicon vias that route the signals from the silicon to the connection terminals and/or leads on the bottom of the package of lidless integrated circuit 208.

In one example, die 204 may include and/or represent a small, diced piece of semiconductor material. In this example, die 204 may include and/or contain one or more circuits that consist of various electrical and/or electronic components (such as resistors, capacitors, and/or transistors). For example, these circuits may be etched into die 204.

Although illustrated as a single unit in FIG. 2, die 204 may alternatively include and/or represent multiple die attached to substrate 202. In one example, all the multiple die may be located and/or positioned within stiffening brace 102. In another example, the multiple die may be stacked together (using, e.g., a "through-silicon vias" technique) and then attached to substrate 202 as a stack. In a further example, a silicon interposer may be attached to substrate 202 first, after which die 204 and/or other components may be attached to the silicon interposer (in, e.g., a "2.5D" package).

In some examples, lidless integrated circuit 208 may also include stiffening brace 102. For example, stiffening brace 102 may be fastened, attached, and/or coupled to substrate 202. As illustrated in FIG. 2, stiffening brace 102 may include and/or form joints 206(1)-(4). In this example, joints 206(1)-(4) may serve as connection points and/or guides that hold removable lid 104 in place over the top surface of substrate 202.

In one example, joints 206(1)-(4) may each include and/or represent a receptacle, slot, and/or trough that accepts a member, peg, and/or pin that extends from removable lid 104. In another example, joints 206(1)-(4) may each include and/or represent a member, peg, and/or pin that fits in a receptacle, slot, and/or trough of removable lid 104. Either way, joints 206(1)-(4) may facilitate joining removable lid 104 to stiffening brace 102. Once removable lid 104 is coupled to and/or placed atop stiffening brace 102, removable lid 104 may provide structural support to lidless integrated circuit 208.

As a result, removable lid 104 may impede lidless integrated circuit 208 from warping during the reflow process. In one example, removable lid 104 may prevent lidless integrated circuit 208 from warping beyond an acceptable degree due to the heat applied during the reflow process. For example, removable lid 104 may mitigate warpage of lidless integrated circuit 208 such that all connection terminals and/or leads on lidless integrated circuit 208 are properly soldered to all corresponding contact pads on the circuit board. This mitigation of warpage may ensure that all connection terminals and/or leads on lidless integrated circuit 208 are communicatively coupled to all the corresponding contact pads on the circuit board.

In other words, none of the solder points between the connection terminals and/or leads on lidless integrated circuit 208 and the corresponding contact pads on the circuit board may suffer from imperfections that disturb and/or harm the circuit board's communicative integrity. Such solder point imperfections include, without limitation, non-wet open defects, head-on-pillow defects, bridged solder joints, stretched solder joints, head-on-pillow open defects, combinations and/or variations of one or more of the same, and/or any other solder point imperfections.

In one example, the slots of the joints 206(1)-(4) may fully or partially extend and/or protrude beyond stiffening brace 102 into substrate 202. For example, substrate 202 may form part of the slots that accept the pins of joints 206(1)-(4) to secure removable lid 104 to lidless integrated circuit 208.

FIG. 3 shows a cross section of an exemplary implementation 300 of an apparatus for mitigating warpage of lidless integrated circuits during reflow processes. As illustrated in FIG. 3, implementation 300 may include and/or represent lidless integrated circuit 208 and a circuit board 302. In this example, lidless integrated circuit 208 may include and/or represent substrate 202, die 204, stiffening brace 102, and removable lid 104. Die 204 may be set on and/or attached or coupled to substrate 202.

In one example, stiffening brace 102 may be coupled to the top surface of lidless integrated circuit 208. More specifically, stiffening brace 102 may be coupled to the top surface of substrate 202. In this example, removable lid 104 may interface with stiffening brace 102 via one or more joints. These joints may maintain removable lid 104 in a somewhat stable and/or secure position during the reflow process.

Removeable lid 104 may temporarily sit atop stiffening brace 102 during the reflow process in which the bottom surface of lidless integrated circuit 208 is soldered to circuit board 302. For example, removable lid 104 may cover die 204 during the reflow process. In addition, removable lid 104 may, in conjunction with stiffening brace 102, provide structural support, tension, and/or integrity to lidless integrated circuit 208. By doing so, removable lid 104 may, in conjunction with stiffening brace 102, prevent lidless integrated circuit 208 from warping too much during the reflow process.

As mentioned above, removable lid 104 may sit and/or rest atop stiffening brace 102 only during the reflow process. In some examples, an automated system may apply removable lid 104 to stiffening brace 102 prior to the reflow process. Alternatively, a human technician may apply removable lid 104 to stiffening brace 102 prior to the reflow process.

For example, a pick-and-place machine may populate circuit board 302 with various electrical and/or electronic components, including lidless integrated circuit 208. In this example, the pick-and-place machine may also place and/or position removable lid 104 on the top surface of lidless integrated circuit 208 by inserting removable lid 104 into stiffening brace 102.

Alternatively, a human technician may use certain tools to populate circuit board 302 with various electrical and/or electronic components, including lidless integrated circuit 208. In this example, the human technician may also place and/or position removable lid 104 on the top surface of lidless integrated circuit 208 by inserting removable lid 104 into stiffening brace 102.

In some examples, removable lid 104 may be applied to stiffening brace 102 by the manufacturer of lidless integrated circuit 208 prior to shipping and/or delivering lidless integrated circuit 208 to a computing equipment assembler and/or vendor. Alternatively, removable lid 104 may be applied to stiffening brace 102 by the computing equipment assembler and/or vendor upon receiving lidless integrated circuit 208 from its manufacturer.

After completion of the reflow process, removable lid 104 may be removed from stiffening brace 102. For example, an automated system (such as a robot) may take off removable lid 104 from stiffening brace 102 once the reflow process has finished and the solder has solidified. Alternatively, a human technician may take off removable lid 104 to stiffening brace 102 once the reflow process has finished and the solder has solidified. Either way, stiffening brace 102 may remain intact and/or coupled to the top of lidless integrated circuit 208 after the removal of removable lid 104 from stiffening brace 102.

In some examples, a heatsink (not illustrated in FIGS. 1-3) may be attached to and/or placed atop die 204 of lidless integrated circuit 208 after the removal of removable lid 104 from stiffening brace 102. For example, an automated system (such as a robot) may apply and/or couple a heatsink to die 204 after the removal of removable lid 104. Alternatively, a human technician may apply and/or couple a heatsink to die 204 after the removal of removable lid 104.

By temporarily applying a removable lid to a lidless integrated circuit during the reflow process, the apparatuses, systems, and methods described herein may enable the integrated circuit to achieve the structural, mechanical, and/or strength benefits of a lidded integrated circuit during the reflow process to mitigate warpage. In addition to facilitating those benefits of a lidded integrated circuit during the reflow process, the apparatuses, systems, and methods described herein may also enable the integrated circuit to preserve the performance, temperature-control, and/or cooling benefits of a lidless integrated circuit after completion of the reflow process and/or during operation. For example, because the dice of lidless integrated circuits are often exposed to open air (rather than being covered by a lid) during operation, these lidless integrated circuits may be able to dissipate heat better than lidded integrated circuits, thereby operating at lower temperatures and/or being able to achieve higher performance than lidded integrated circuits.

Figure 4:
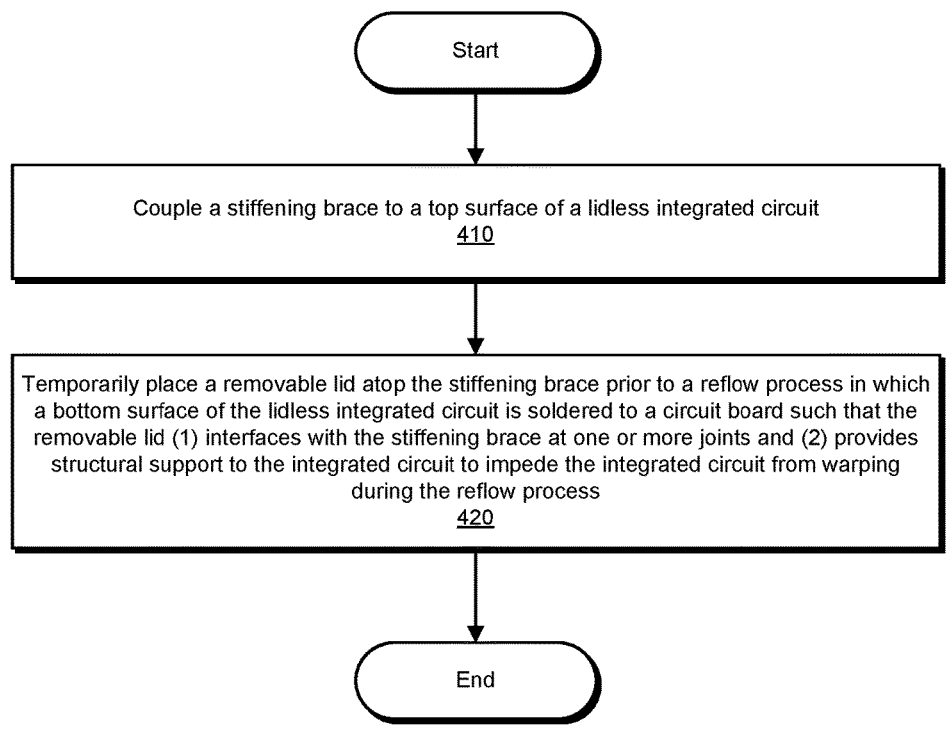
FIG. 4 is a flow diagram of an exemplary method for mitigating warpage of lidless integrated circuits during reflow processes.

FIG. 4 is a flow diagram of an exemplary method 400 for mitigating warpage of lidless integrated circuits during reflow processes. As illustrated in FIG. 4, method 400 may include the step of coupling a stiffening brace to a top surface of a lidless integrated circuit (410). This coupling step may be performed in a variety of ways and/or contexts. For example, an integrated circuit manufacturer and/or a computing equipment manufacturer or vender may manually or automatically couple a stiffening brace to the top surface of a package of a lidless integrated circuit.

Returning to FIG. 4, method 400 may also include the step of temporarily placing a removable lid atop the stiffening brace prior to a reflow process in which a bottom surface of the lidless integrated circuit is soldered to a circuit board (920). This temporary placement step may be performed in a variety of ways and/or contexts. For example, an integrated circuit manufacturer and/or a computing equipment manufacturer or vender may manually or automatically place a removable lid atop the stiffening brace prior to a reflow process. In this example, the integrated circuit manufacturer and/or computing equipment manufacturer or vendor may insert the removable lid into the stiffening brace to secure the removable lid for the reflow process.

Upon insertion, the removable lid may interface with the stiffening brace at one or more joints. Additionally or alternatively, the removable lid may provide structural support, tension, strength, and/or integrity to the lidless integrated circuit during the reflow process. As a result, the removable lid may effectively mitigate warpage and/or impede the lidless integrated circuit from warping during the reflow process. Upon completion of the reflow process, the removable lid may be removed from the stiffening brace to expose the die to the open air, thereby enabling the integrated circuit to provide the same performance, temperature-control, and/or cooling benefits as other lidless integrated circuits.

While the foregoing disclosure sets forth various embodiments using specific illustrations, flowcharts, and examples, each illustration component, flowchart step, operation, and/or component described and/or exemplified herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a stiffening ring that:
      is fixed to a substrate of a lidless integrated circuit;
      encompasses a die of the lidless integrated circuit; and
      includes a plurality of slots that open upward from the substrate;
   a removable lid that:
      includes a plurality of pegs that fit in the slots of the stiffening ring;
      interfaces with the stiffening ring via insertion of the pegs into the slots;
      temporarily sits atop the stiffening ring during a reflow process in which a bottom surface of the lidless integrated circuit is soldered to a circuit board; and
      provides structural support to the lidless integrated circuit to impede the lidless integrated circuit from warping during the reflow process.

2. The apparatus of claim 1, wherein the removable lid is removed from the stiffening ring after completion of the reflow process.

3. The apparatus of claim 1, wherein the stiffening ring:
   is fixed to a top surface of the substrate of the lidless integrated circuit; and
   surrounds the die of the lidless integrated circuit.

4. The apparatus of claim 1, wherein the lidless integrated circuit is packaged as a surface-mount component.

5. The apparatus of claim 4, wherein the surface-mount component comprises a Ball Grid Array (BGA) package.

6. The apparatus of claim 1, wherein the removable lid prevents the substrate of the lidless integrated circuit from warping beyond a certain degree during the reflow process.

7. The apparatus of claim 1, wherein the removable lid impedes the lidless integrated circuit from warping such that all connection terminals included on the lidless integrated circuit:
   are soldered to all corresponding contact pads on the circuit board; and
   are communicatively coupled to all the corresponding contact pads on the circuit board.

8. The apparatus of claim 1, wherein the removable lid is placed atop the stiffening ring by a pick-and-place machine prior to the reflow process.

9. A lidless integrated circuit comprising:
   a die;
   a stiffening ring that:
      is fixed to a substrate of the lidless integrated circuit;
      encompasses the die; and
      includes a plurality of slots that open upward from the substrate;
   a removable lid that:
      includes a plurality of pegs that fit in the slots of the stiffening ring;
      interfaces with the stiffening ring via insertion of the pegs into the slots;
      temporarily sits atop the stiffening ring during a reflow process in which a bottom surface of the lidless integrated circuit is soldered to a circuit board; and
      provides structural support to the lidless integrated circuit to impede the lidless integrated circuit from warping during the reflow process.

10. The lidless integrated circuit of claim 9, wherein the removable lid is removed from the stiffening ring after completion of the reflow process.

11. The lidless integrated circuit of claim 9, wherein the stiffening ring is fixed to a top surface of the substrate of the lidless integrated circuit.

12. The lidless integrated circuit of claim 9, wherein the lidless integrated circuit is packaged as a surface-mount component.

13. The lidless integrated circuit of claim 12, wherein the surface-mount component comprises a Ball Grid Array (BGA) package.

14. A method comprising:
fixing a stiffening ring to a top surface of a substrate of a lidless integrated circuit such that the stiffening ring encompasses a die of the lidless integrated circuit; and
temporarily placing a removable lid atop the stiffening ring prior to a reflow process in which a bottom surface of the substrate of the lidless integrated circuit is soldered to a circuit board such that the removable lid:
  interfaces with the stiffening ring via insertion of a plurality of pegs of the removable lid into a plurality of slots of the stiffening ring, wherein the slots of the stiffening ring open upward from the substrate; and
  provides structural support to the lidless integrated circuit to impede the lidless integrated circuit from warping during the reflow process.

15. The method of claim 14, further comprising removing the removable lid from the stiffening ring after completion of the reflow process.

16. The method of claim 15, further comprising attaching a heatsink to the die of the lidless integrated circuit after removing the removable lid from the stiffening ring.

17. The method of claim 16, further comprising maintaining the stiffening ring fixed to the top surface of the lidless integrated circuit after removing the removable lid from the stiffening ring.

* * * * *